(12) United States Patent
Katagiri et al.

(10) Patent No.: US 10,804,084 B2
(45) Date of Patent: Oct. 13, 2020

(54) VACUUM APPARATUS

(71) Applicant: HITACHI HIGH-TECHNOLOGIES CORPORATION, Tokyo (JP)

(72) Inventors: Souichi Katagiri, Tokyo (JP); Keigo Kasuya, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 309 days.

(21) Appl. No.: 15/760,498

(22) PCT Filed: Sep. 16, 2015

(86) PCT No.: PCT/JP2015/076250
§ 371 (c)(1),
(2) Date: Mar. 15, 2018

(87) PCT Pub. No.: WO2017/046886
PCT Pub. Date: Mar. 23, 2017

(65) Prior Publication Data
US 2018/0254173 A1  Sep. 6, 2018

(51) Int. Cl.
*H01J 41/16* (2006.01)
*H01J 41/20* (2006.01)
(Continued)

(52) U.S. Cl.
CPC ............. *H01J 41/20* (2013.01); *F04B 37/02* (2013.01); *H01J 37/073* (2013.01); *H01J 37/28* (2013.01);
(Continued)

(58) Field of Classification Search
CPC . F04B 37/02; F04B 37/04; H01J 41/16; H01J 41/20; H01J 37/18; H01J 37/28; H01J 2237/1825; H01J 2237/184
See application file for complete search history.

(56) References Cited

U.S. PATENT DOCUMENTS 3,827,829 A * 8/1974 Tom .................. H01J 41/20
  417/49
4,833,362 A    5/1989 Crewe
(Continued)

FOREIGN PATENT DOCUMENTS

JP  1992-065057 A   3/1992
JP  1994-111745 A   4/1994
(Continued)

OTHER PUBLICATIONS

"Stabilization of a Tungsten <310> Cold Field Emitter", Journal of Vacuum Science and Technology B 28 (5), Sep./Oct. 2010.
(Continued)

*Primary Examiner* — Eliza W Osenbaugh-Stewart
(74) *Attorney, Agent, or Firm* — Volpe and Koenig, P.C.

(57) ABSTRACT

In a vacuum apparatus including an ultrahigh vacuum evacuation pump, the ultrahigh vacuum evacuation pump is provided with a rod-shaped cathode including a non-evaporable getter alloy, a cylindrical anode disposed so as to surround the cathode, and a coil or a ring-shaped permanent magnet disposed so as to sandwich upper and lower openings of the cylindrical anode and surround the rod-shaped cathode. As a result, it is possible to reduce the size and weight of the ultrahigh vacuum evacuation pump and to dispose the vacuum evacuation pump at a desired location in the vacuum apparatus.

15 Claims, 10 Drawing Sheets

(51) Int. Cl.
    *F04B 37/02*     (2006.01)
    *H01J 37/073*    (2006.01)
    *H01J 37/28*     (2006.01)

(52) U.S. Cl.
    CPC ....... *H01J 41/16* (2013.01); *H01J 2237/1825* (2013.01); *H01J 2237/28* (2013.01)

(56) References Cited

U.S. PATENT DOCUMENTS

| | | | |
|---|---|---|---|
| 5,399,860 A | | 3/1995 | Miyoshi et al. |
| 5,442,183 A | | 8/1995 | Matsui et al. |
| 6,142,742 A | * | 11/2000 | Krueger ................ C23C 14/564 |
| | | | 417/48 |
| 6,495,786 B1 | | 12/2002 | Tsuji et al. |
| 2008/0315122 A1 | * | 12/2008 | Katagiri .................. H01J 37/18 |
| | | | 250/492.1 |
| 2009/0134018 A1 | * | 5/2009 | Watanabe ............. C23C 14/564 |
| | | | 204/298.03 |

FOREIGN PATENT DOCUMENTS

| | | |
|---|---|---|
| JP | 1995-312202 A | 11/1995 |
| JP | 2000-149850 A | 5/2000 |
| JP | 2001-110286 A | 4/2001 |
| WO | 2014/132758 A1 | 9/2014 |

OTHER PUBLICATIONS

International Search Report for WO 20171046886 A1, dated Nov. 17, 2015.

* cited by examiner

VACUUM APPARATUS

TECHNICAL FIELD

The present invention relates to a vacuum apparatus.

BACKGROUND ART

A vacuum apparatus, for example, a scanning electron microscope (SEM), a transmission electron microscope (TEM), and an electron beam drawing apparatus (EB), accelerates an electron beam emitted from an electron gun including a field emission type or thermal field emission type electron source, and a thin electron beam is formed with an electron lens and scanned as a primary electron beam on a sample by using a scanning deflector. In the case of the SEM, the obtained secondary electrons or reflected electrons are detected to obtain an image. In the case of the TEM, an electron beam passing therethrough is imaged. In the EB, a pattern registered beforehand is drawn on a resist film coated on a sample. Tungsten is used as a material of the electron source in the case of a general purpose SEM. Further, in electron sources for semiconductors, zirconia may be contained in tungsten. Furthermore, in the case of EB, $LaB_6$ may be used.

To emit a superior electron beam from the electron source over a long period of time, it is necessary to keep the periphery of an electron source 115 in FIG. 3 at ultrahigh vacuum ($10^{-7}$ to $10^{-8}$ Pa). Particularly, when a cold cathode field emission electron source is used, it is known that a highly bright and stable electron beam can be obtained by further raising the vacuum around the electron source to an ultrahigh vacuum level ($10^{-9}$ to $10^{-10}$ Pa). Therefore, conventionally, as a configuration for obtaining ultrahigh vacuum, a method of differentially evacuating the periphery of an electron gun 116 with a plurality of ion pumps 113-1, 113-2, and 113-3 has been adopted. Although the ion pump has an advantage that it can maintain ultrahigh vacuum of $10^{-8}$ Pa or less by energization only without having a movable portion, the ion pump has a size of several tens of centimeters square or more, and a magnetic shield is needed on the electron gun side to generate a magnetic field, and therefore a considerable volume is required. As a method of eliminating the ion pumps to reduce the size, PTL 1 and PTL 2 disclose that a non-evaporable getter pump is incorporated, or PTL 3 discloses an electron gun which does not include an ion pump by incorporating a non-evaporable getter pump.

In addition, NPL 1 discloses that a further high ultrahigh vacuum can be achieved by using the ion pump and the non-evaporable getter pump in combination. Since the ion pump obtains an evacuation speed by sputtering titanium using residual gas molecules, when a pressure decreases, and the degree of vacuum increases to about $10^{-8}$ Pa, the residual gas decreases, and the evacuation speed becomes almost zero. Therefore, no further degree of vacuum could be obtained. By using a non-evaporable getter pump in combination with this, the vacuum level of an ultrahigh vacuum region can be obtained.

On the other hand, even when only the non-evaporable getter pump is used, the ultrahigh vacuum level is the limit. This depends on the exhaust principle of the non-evaporable getter pump. The non-evaporable getter pump is a type of hydrogen absorbing alloy, and an evacuation speed is obtained through adsorption and immobilization of molecules adsorbable on a surface among gas molecules other than hydrogen. In addition to these adsorbable gas molecules, some gas molecules cannot be adsorbed. Electrically inert gases such as rare gas like argon or helium or methane are the gas molecules which cannot be adsorbed. A few percentage of argon gas is contained in the atmosphere, and methane gas is often present as residual gas in ultrahigh vacuum. Therefore, it becomes difficult to obtain ultrahigh vacuum with these gases by using the non-evaporable getter pump alone.

Further, PTL 4 discloses a vacuum evacuation pump combining an evaporable getter and a magnetron discharge. Since a hydrogen vapor pressure of titanium as an evaporable getter material is around $10^{-8}$ Pa, it is inherently difficult to obtain ultrahigh vacuum in this configuration. In addition, since a strong permanent magnet is required on the outer periphery of a column as a unit for generating a magnetic field, it is difficult to reduce the weight of the pump.

CITATION LIST

Patent Literatures

PTL 1: U.S. Pat. No. 4,833,362
PTL 2: JP H6-111745 A
PTL 3: JP 2000-149850 A
PTL 4: JP H7-312202 A

Non-Patent Literature

NPL 1: "Stabilization of a Tungsten <310> Cold Field Emitter", Journal of Vacuum Science and Technology B 28 (5), September/October 2010

SUMMARY OF INVENTION

Technical Problem

As illustrated in FIG. 3, an optical system lens barrel of a charged particle beam apparatus such as an electron microscope and an electron beam drawing apparatus is provided with the electron gun 116 at the top, the electron source 115 as a light source is included inside the electron gun 116, and optical elements such as an extraction electrode 112, a diaphragm 117, a condenser lens 118, an objective lens 119 are disposed in series under the electron source 115, and finally a chamber storing an observation sample 120 is coupled. In such a structure, when the ion pump 113-1 and a non-evaporable getter pump 114 are disposed at the top, the center of gravity of the optical lens barrel rises up to near the top and comes to a position several tens of centimeters away from an optical axis in the horizontal direction. In this state, when vibration is applied to apparatus, the electron gun easily swings as illustrated in the drawing, and as the optical axis moves, the position of a point light source moves. The electron beam emitted from this light source is thinned and narrowed by an optical system and projected on a surface of the observation sample 120. By scanning on the sample surface, an image can be obtained. However, as the light source position moves, the position where the electron beam illuminates also moves. Therefore, there arises a problem that an image is blurred, and the resolution lowered.

Such resolution degradation has been conventionally solved by increasing the rigidity of a lens barrel. However, with the improvement of the resolution required for a charged particle beam apparatus, it becomes difficult to solve this problem only by this measure. Further, in a measurement SEM for measuring the fine pattern shape or dimension of a semiconductor device, due to an increase in the diameter of a wafer as an observation sample, it is inevitable to increase the size and weight of the apparatus. Under such conditions, low vibration due to the improvement of rigidity is getting difficult as it leads to a further increase in weight. Examples of a vibration source include movement of the center of gravity accompanying driving of a stage on which a sample is placed, vibration of a turbo molecular pump for vacuum evacuation, and sound waves outside the apparatus, and it is functionally difficult to eliminate these from the apparatus.

Solution to Problem

As an embodiment for achieving the above-described object, in a vacuum apparatus having at least one ultrahigh vacuum evacuation pump, the ultrahigh vacuum evacuation pump includes a rod-shaped cathode including a non-evaporable getter alloy, a cylindrical anode disposed so as to surround the cathode, and a coil or ring-shaped permanent magnet disposed so as to sandwich upper and lower openings of the cylindrical anode and surround the rod-shaped cathode.

Further, in the vacuum apparatus, the vacuum apparatus is a charged particle beam apparatus, and the ultrahigh vacuum evacuation pump evacuates a region where a charged particle source of the charged particle beam apparatus is disposed.

Advantageous Effects of Invention

According to the present invention, a vacuum apparatus can be provided which can dispose an ultrahigh vacuum evacuation pump at a desired position (to improve a margin of the arrangement position). Further, in the case where the vacuum apparatus is a charged particle beam device, it is possible to suppress a decrease in resolution caused by an exhaust system.

DESCRIPTION OF EMBODIMENTS

Figure 1:
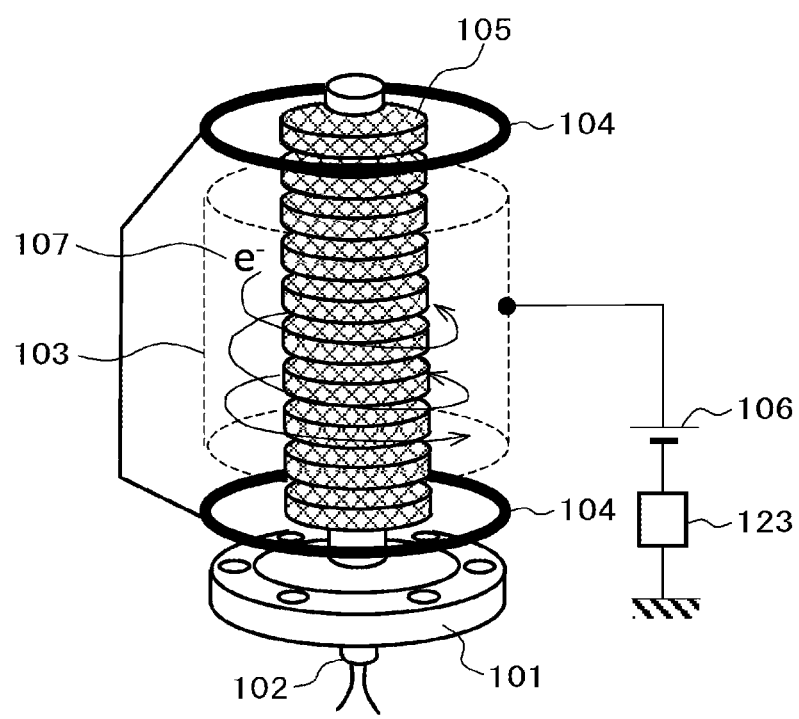
FIG. 1 is a perspective view illustrating an example of an ultrahigh vacuum evacuation pump in a vacuum apparatus according to a first embodiment of the present invention.

The inventors of the present invention have studied the above-described problem and invented a non-evaporable getter pump as a rod-shaped cathode. A part of its periphery is surrounded with a cylindrical electrode, and a plus high voltage is applied to the electrode to make it an anode. Further, along the rod-shaped cathode, a unit for providing a magnetic field is provided, and electrons are injected into this structure to form an ultrahigh vacuum evacuation pump with a magnetron structure. This makes it possible to reduce the size and weight of the ultrahigh vacuum evacuation pump and to dispose the vacuum evacuation pump at a desired position in a vacuum apparatus (to improve a margin of the arrangement position). In a charged particle beam apparatus, it is possible to evacuate methane gas, which cannot be exhausted by a non-evaporable getter pump, by ionizing and decomposing the methane gas with magnetron, and the inside of an electron gun can be ultrahigh vacuum without using an ion pump. For this reason, as an ultrahigh vacuum evacuation pump, instead of using an ion pump and a non-evaporable getter pump in combination, by using a magnetron structure with a non-evaporable getter pump as a cathode (an ultrahigh vacuum evacuation pump having this structure is hereinafter referred to as a magnetron non-evaporable getter pump), the weight of the ultrahigh vacuum evacuation pump is greatly reduced, and vibration of an optical lens barrel is suppressed. Therefore, image shake is resolved, and reduction in resolution can be suppressed.

Embodiments of the present invention will be described below with reference to the drawings. In the embodiments, a charged particle beam apparatus such as a scanning electron microscope (SEM) will be described as an example, but the present invention is not limited thereto and can be applied to a vacuum apparatus. Note that the same reference numerals denote the same constituent elements.

First Embodiment

Figure 3:
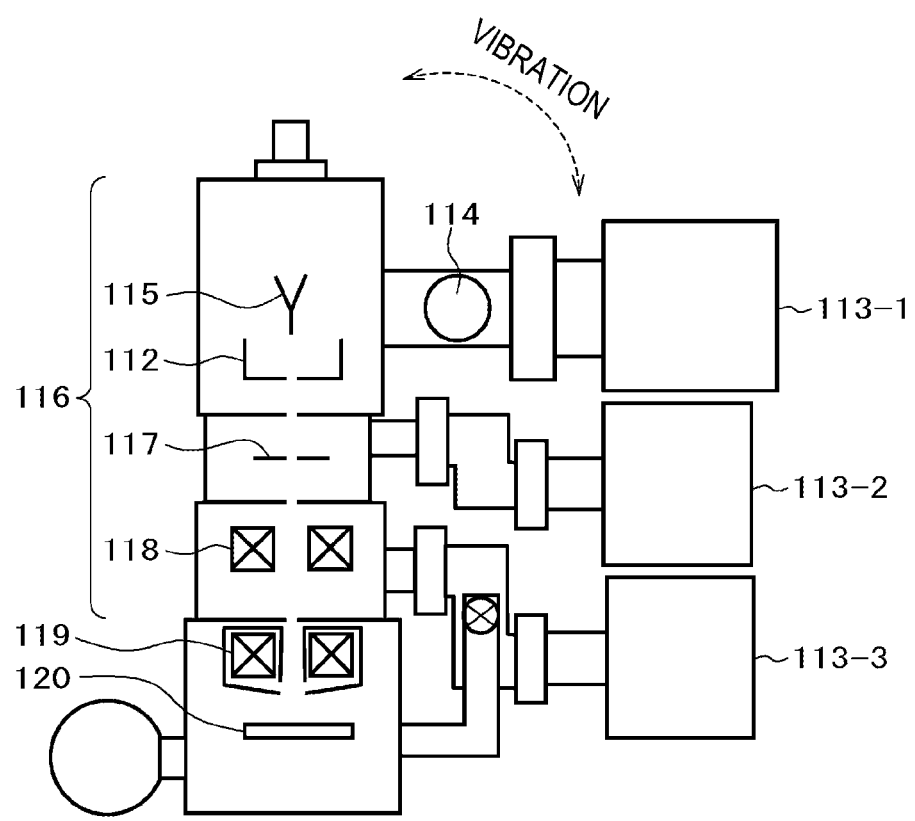
FIG. 3 is a cross-sectional view of the entire configuration of a scanning electron microscope including a conventional field emission electron gun.
Figure 4:
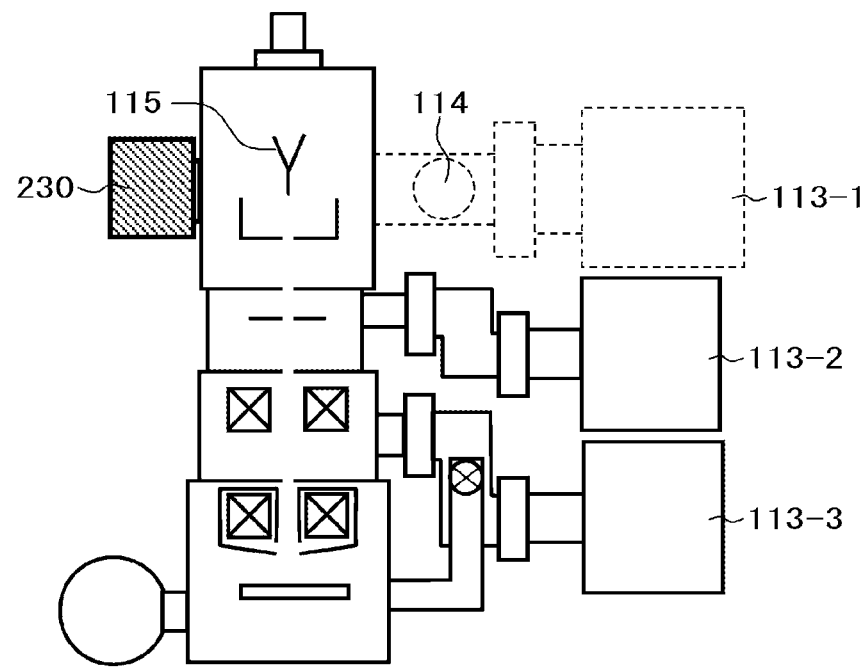
FIG. 4 is a cross-sectional view of the entire configuration of the vacuum apparatus (scanning electron microscope) according to the first embodiment of the present invention.

A first embodiment of the present invention will be described with reference to the drawings. FIG. 4 is a cross-sectional view of the entire configuration of a scanning electron microscope according to the present embodiment. This scanning electron microscope is equipped with an optical column (lens barrel) having a field emission type cold cathode electron source 115 with high monochromaticity and a small light source diameter in an electron gun. Normally, when the degree of vacuum in an electron gun chamber in which the electron source 115 is disposed is ultrahigh vacuum, as shown in FIG. 3, a differential exhaust structure of about three stages is applied. Further, each chamber is evacuated by the ion pumps 113-1, 113-2, and 113-3, and a non-evaporable getter pump 114 is also used for exhaust in the most upstream chamber including the electron source 115. On the other hand, in the present embodiment, as illustrated in FIG. 4, instead of using the exhaust ion pump 113-1 of a chamber having the most upstream electron source 115 and the non-evaporable getter pump in combination, a magnetron non-evaporable getter pump 230 to be described below is disposed. As a result, it is possible to eliminate the ion pump 113-1 and the non-evaporable getter pump 114, which have been conventionally needed, indicated by broken lines and to reduce the size and weight of the microscope.

Figure 12:
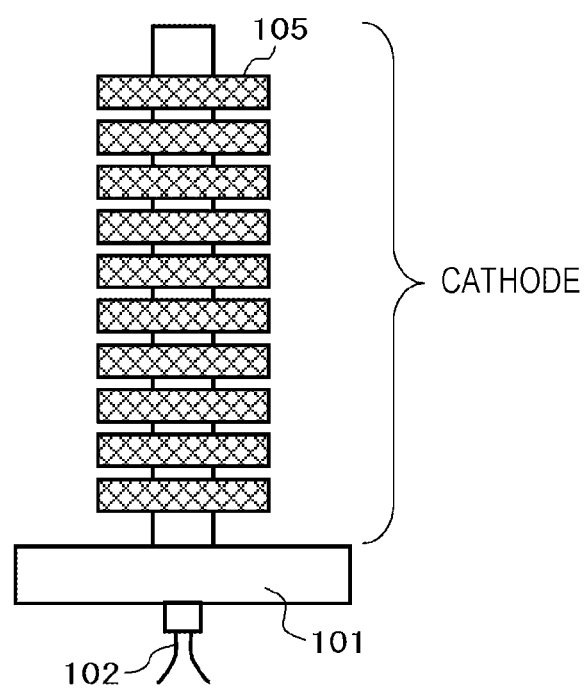
FIG. 12 is a side view for describing the cathode of the ultrahigh vacuum evacuation pump in the vacuum apparatus according to the first embodiment of the present invention.

Next, a magnetron non-evaporable getter pump in the scanning electron microscope according to the present embodiment will be described with reference to FIG. 1. A rod-shaped non-evaporable getter pump 101 is used as a cathode. The non-evaporable getter pump 101 is obtained by arranging a rod-shaped heater 102 and a non-evaporable getter alloy 105 molded in a ring shape around the heater 102. As illustrated in FIG. 12, the portion used as a cathode is, to be exact, a portion where a plurality of non-evaporable getter alloys 105 is disposed around a pipe (an end on the side opposite to the side where the rod-shaped heater is inserted is sealed (vacuum-sealed)) into which the rod-shaped heater is inserted. Here, the cathode is denoted by the same reference numeral as that of the non-evaporable getter pump.

A cylindrical anode 103 surrounds the cathode 101 to apply a plus high DC voltage (about 0.01 to 10 kV) by a high voltage power source 106. Further, a Helmholtz coil 104 is disposed at a position sandwiching the anode 103 and surrounding the rod-shaped cathode to form a uniform magnetic field (100 to 600 G) along the rod-shaped cathode 101. Although it is not necessarily required to be a Helmholtz coil, a Helmholtz coil is preferable in consideration of the uniformity of the magnetic field on the central axis of the coil.

Figure 2:
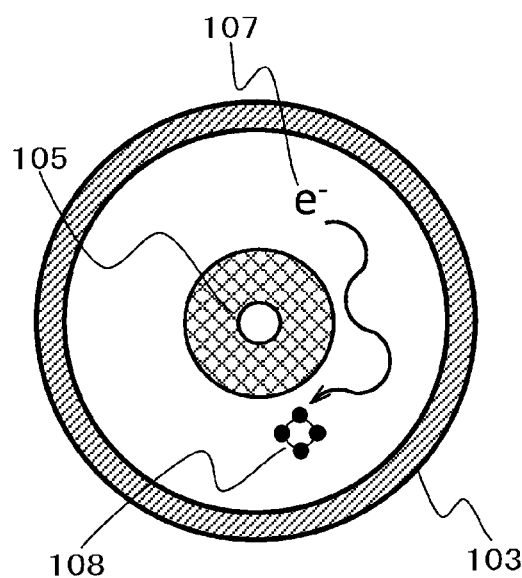
FIG. 2 is a cross-sectional view for describing a vacuum evacuation function in the ultrahigh vacuum evacuation pump illustrated in FIG. 1. The upper view illustrates a state before electrons collide with gas molecules. The lower view illustrates a state where ionized gas molecule ions are exhausted after collision of electrons with gas molecules.
Figure 2:
Figure 2:
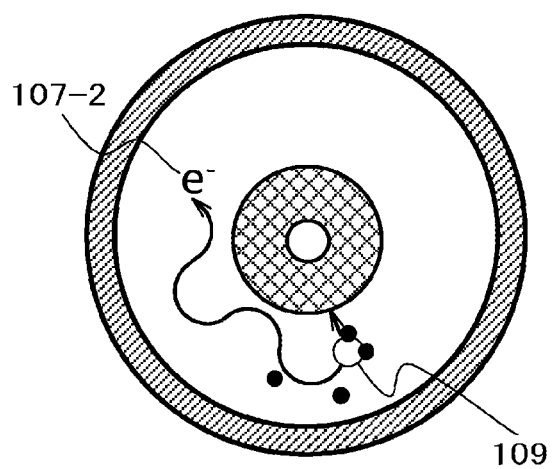

Under such conditions, when the electrons 107 enter between the anode 103 and the cathode 101 (non-evaporable getter alloy 105), as illustrated in FIG. 2, the electrons 107 are moved to rotate around the cathode 101 (the non-evaporable getter alloy 105) under the influence of an electric field and a magnetic field. When the electrons 107 collide with the floating gas molecules 108 in the process of moving over a long distance, the gas molecules are ionized. As a result, in non-evaporable getter pump, even with methane molecules 108 which is not easily exhausted, by ionizing to form charged particles 109, the molecules can be exhausted by the non-evaporable getter pump, and a practical evacuation speed can be obtained. The reference numeral 107-2 denotes electrons which collide with the gas molecules 108 and are ionized.

Figure 5:
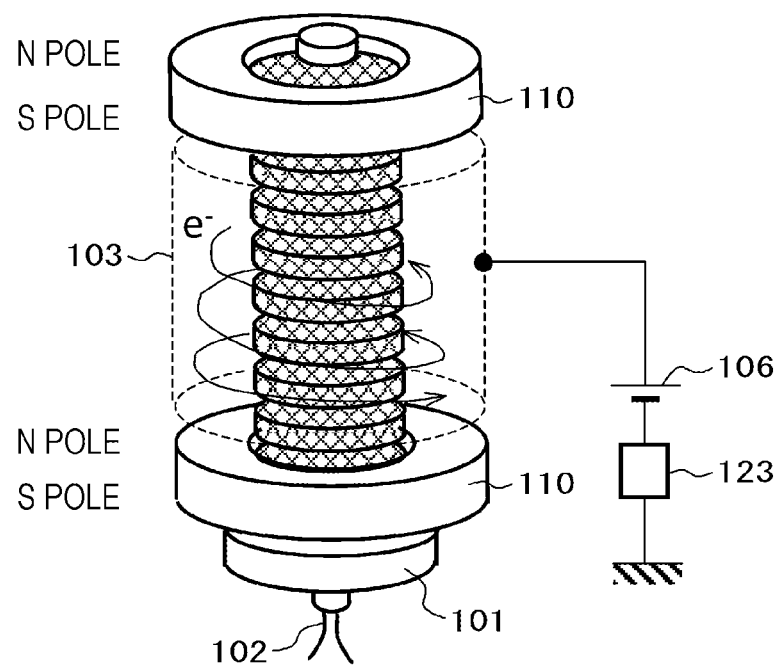
FIG. 5 is a perspective view illustrating another example of an ultrahigh vacuum evacuation pump in the vacuum apparatus according to the first embodiment of the present invention.

Although the Helmholtz coil 104 is used here as a unit for generating a uniform magnetic field, a permanent magnet may be used. In that case, as illustrated in FIG. 5, ring-shaped permanent magnets 110 may be disposed on both ends of the anode such that the N pole and the S pole face each other. It is clear that connecting the two magnets with a yoke is preferable because the intensity of the magnetic field formed between the cathode 101 and the anode 103 is increased.

A magnetron non-evaporable getter pump performs exhaust with the mechanism described above. Therefore, by increasing the number of electrons entering the region sandwiched between the cathode and anode, a collision probability between electrons and gas molecules increases, and the evacuation speed can be improved. Therefore, by providing an electron source in the vicinity of the magnetron non-evaporable getter pump, the ionization efficiency of gas molecules can be improved.

Figure 6:
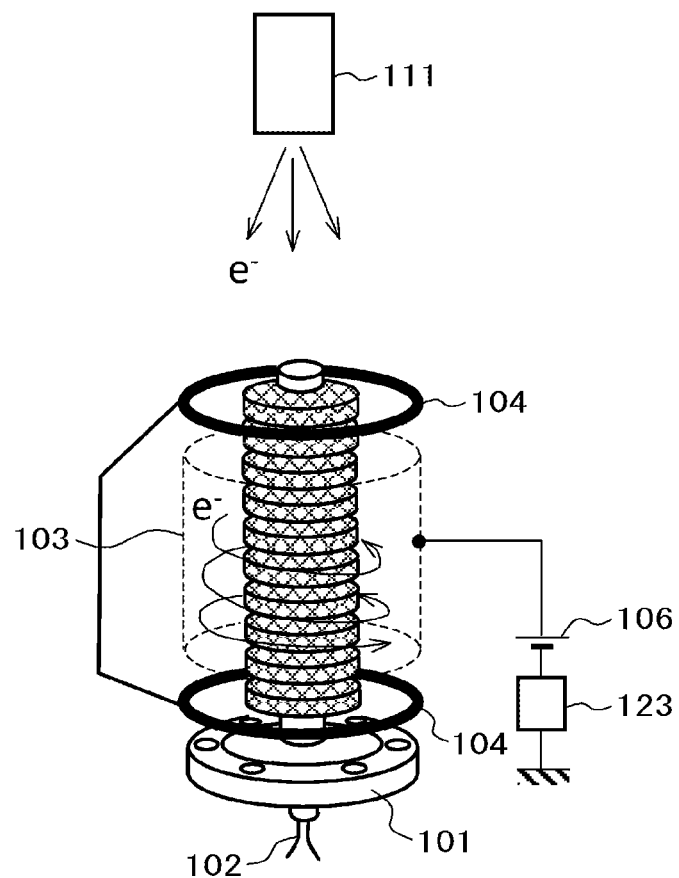
FIG. 6 is a perspective view illustrating another example of the ultrahigh vacuum evacuation pump in the vacuum apparatus according to the first embodiment of the present invention.

FIG. 6 is a perspective view of a magnetron non-evaporable getter pump in the case where an ionization vacuum gauge is used as an electron source. It is desirable to use an ionization vacuum gauge 111 as an electron source as illustrated in FIG. 6. This is because the ionization vacuum gauge 111 is a gauge which discharges, for example, heat electrons from about 10 μA to 1 mA and knows the degree of vacuum by collecting charged particles generated by collision with gas molecules in a collector, and the degree of vacuum in an electron gun chamber can be simultaneously measured while emitting the electrons.

Figure 7:
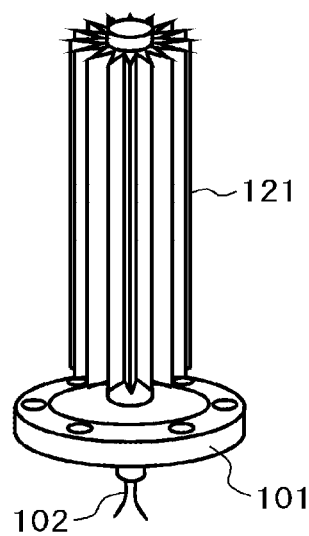
FIG. 7 is a perspective view illustrating another example of a cathode in the ultrahigh vacuum evacuation pump in the vacuum apparatus according to the first embodiment of the present invention.

The non-evaporable getter pump used as a cathode has a structure in which the non-evaporable getter alloys 105 sintered in a disk shape are aligned as illustrated in FIGS. 1, 5, and 6. In addition, for example, as illustrated in FIG. 7, a structure 121 can be also applied in which a non-evaporable getter alloy film formed on a metal sheet is folded into a bellows and wrapped around a pipe into which the heater 102 is inserted.

Next, the exhaust mechanism of a non-evaporable getter pump using a non-evaporable getter alloy will be described. Since the non-evaporable getter alloy is basically a hydrogen absorbing alloy, hydrogen is occluded until occluded hydrogen in the alloy is saturated. Although other gas molecules are exhausted by being adsorbed on the surface of the non-evaporable getter alloy, as a precondition, the alloy surface is a clean surface, and it is necessary to minimize substances other than alloys. To obtain such a clean surface, heating the non-evaporable getter alloy in vacuum is needed before use. Thus, the molecules adsorbed on the surface diffuse into the alloy, and the surface becomes clean. At this time, since a large amount of hydrogen already occluded is discharged, heating is performed as an initialization process before use. In the present embodiment, a heater for heating is inserted into a pipe from the atmosphere side and has an output capable of raising the temperature to 500 to 600° C. On the other hand, the non-evaporable getter alloy used in this study is one that can be activated by heating at 350° C. or higher and can be sufficiently activated by heating for about 1 hour after the temperature is raised. After heating, it is only necessary to cool naturally and to wait for cooling to room temperature.

In the present embodiment, an example has been described in which a magnetron non-evaporable getter pump is used instead of the ion pump 113-1 and the non-evaporable getter pump 114 used for differential evacuation of an electron gun of the conventional scanning electron microscope illustrated in FIG. 3. It goes without saying that a magnetron non-evaporable getter pump may be used instead of other ion pumps. For example, two ion pumps 113-1 and 113-2 on the upstream side may be exchanged, or all the three ion pumps 113-1, 113-2, and 113-3 may be replaced.

Further, in the present embodiment, the scanning electron microscope has been described as an example, but the present invention is not limited thereto, and it is also possible to use a charged particle beam apparatus such as an electron beam drawing apparatus, a transmission electron microscope, a processing apparatus and an observation apparatus using an ion beam, and other vacuum apparatuses may be used.

In a vacuum start-up sequence, after activating the non-evaporable getter pump for about 1 hour at the final stage of normal baking, each heater is stopped and allowed to cool naturally. At this time, as illustrated in FIG. 1, it is advisable that the value of current flowing from the anode to the cathode is monitored by an ammeter 123, and electric and magnetic fields are adjusted such that an appropriate current value is obtained. It is preferable to adjust the anode voltage in the range of 0.01 to 10 kV and the magnetic field in the range of about 100 to 500 G.

In the scanning electron microscope equipped with the magnetron non-evaporable getter pump according to the present embodiment, an ultrahigh vacuum of the order of $10^{-10}$ Pa is obtained as the ultimate vacuum after the vacuum of the electron gun has been started up. When the same electron gun is evacuated with only an ion pump, the vacuum is on the order of $10^{-8}$ Pa, and when an ion pump and a non-evaporable getter pump are used together, the vacuum is on the order of $10^{-10}$ Pa. Therefore, it has been confirmed for the first time that ultrahigh vacuum of the order of $10^{-10}$ Pa can be obtained without an ion pump by using the magnetron non-evaporable getter pump according to the present embodiment. In addition, the weight saving due to elimination of one ion pump is about 20 kg. As a result, the vibration of an optical lens barrel is reduced by 10% or more, image shake is reduced or eliminated, and the reduction in resolution is suppressed.

As described above, according to the present embodiment, it is possible to provide a vacuum apparatus capable of disposing an ultrahigh vacuum evacuation pump at a desired location. Further, in the case where the vacuum apparatus is a charged particle beam device, it is possible to suppress a decrease in resolution caused by an exhaust system.

Second Embodiment

An ultrahigh vacuum evacuation pump in a scanning electron microscope according to the second embodiment of the present invention will be described. Matters described in the first embodiment and not described in the present embodiment can also be applied to the present embodiment unless there are special circumstances.

Figure 8:
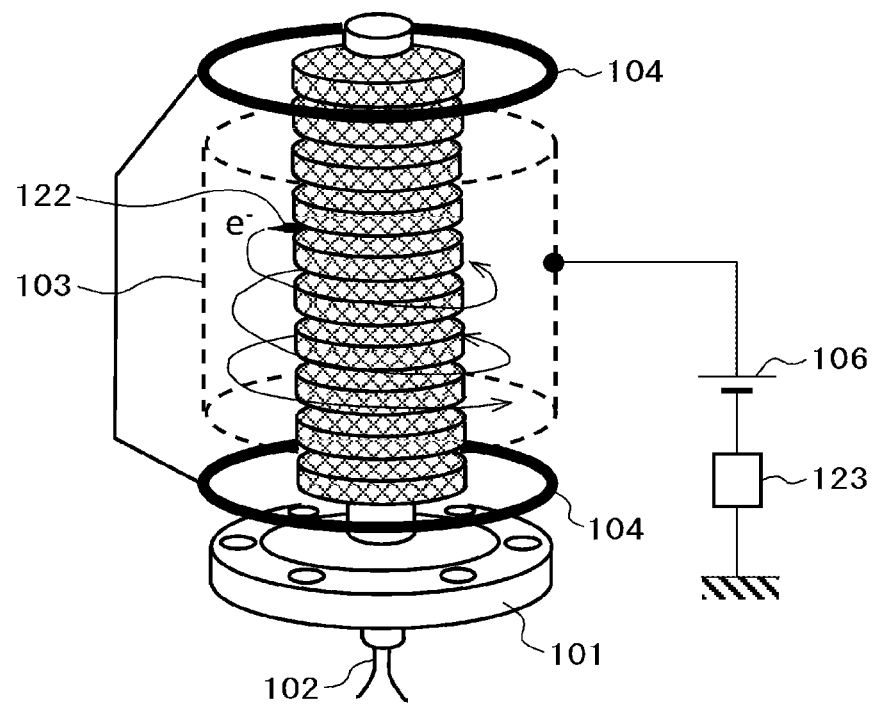
FIG. 8 is a perspective view illustrating an example of an ultrahigh vacuum evacuation pump in a vacuum apparatus according to a second embodiment of the present invention.

FIG. 8 is a perspective view illustrating an example of a magnetron non-evaporable getter pump in a scanning electron microscope according to the present embodiment. This magnetron non-evaporable getter pump includes an electron source (unit for supplying electrons) 122 disposed between or in the vicinity of a non-evaporable getter pump 101 as a cathode 101 and a cylindrical anode 103. As the electron source 122, a needle having a sharp tip of a rod of single crystal tungsten is fixed facing the cathode surface. A strong electric field caused by a high voltage applied to the anode 103 concentrates on the tip of the single crystal tungsten needle, and therefore electrons are emitted by tunneling from the inside of tungsten. Although the crystal orientation of the tip of the needle is desired to be <310> and <110>, there is no restriction to specify a specific plane orientation in particular. That is, polycrystalline tungsten may be used as long as it is molded into a shape capable of obtaining a predetermined emission current. In the present embodiment, the number of needles is one, but it is also possible to have a plurality of needles. In case of breakdown, it goes without saying that it is desirable that a plurality of needles is provided.

In this structure, since the electrons can be obtained only by fixing the needle-like rod, the structure is simple. It also does not consume the energy required for electron beam emission. Therefore, energy saving effect can also be obtained.

When vacuum start-up and atmospheric release are repeated, the surface of an incorporated electron source is contaminated with deposits and the like, and electron emission may be hindered. As a countermeasure, it is advisable to provide a unit for heating the electron source at the base of the needle. By heating, the molecules adhering to the needle portion at the tip of a power source are re-emitted, and the cleaned surface is exposed. It is desirable that gas molecules adhered before a heating process can be eliminated if vacuum is started up after atmospheric release, and the heating process is performed using this heating unit immediately before driving a pump.

When the magnetron non-evaporable getter pump illustrated in FIG. 8 is attached to the scanning electron microscope illustrated in FIG. 4, and an image is observed, the vibration of an optical lens barrel is suppressed, image shake is resolved, and the reduction in resolution is suppressed.

According to the present embodiment, the same effects as in the first embodiment can be obtained. In addition, by using a needle with a sharp tip of a crystalline metal rod as an electron source, the structure can be simplified, and energy saving can be achieved.

Third Embodiment

An ultrahigh vacuum evacuation pump in a scanning electron microscope according to the third embodiment of the present invention will be described. Matters described in the first or second embodiment and not described in the present example can also be applied to the present example unless there are special circumstances.

Figure 9:
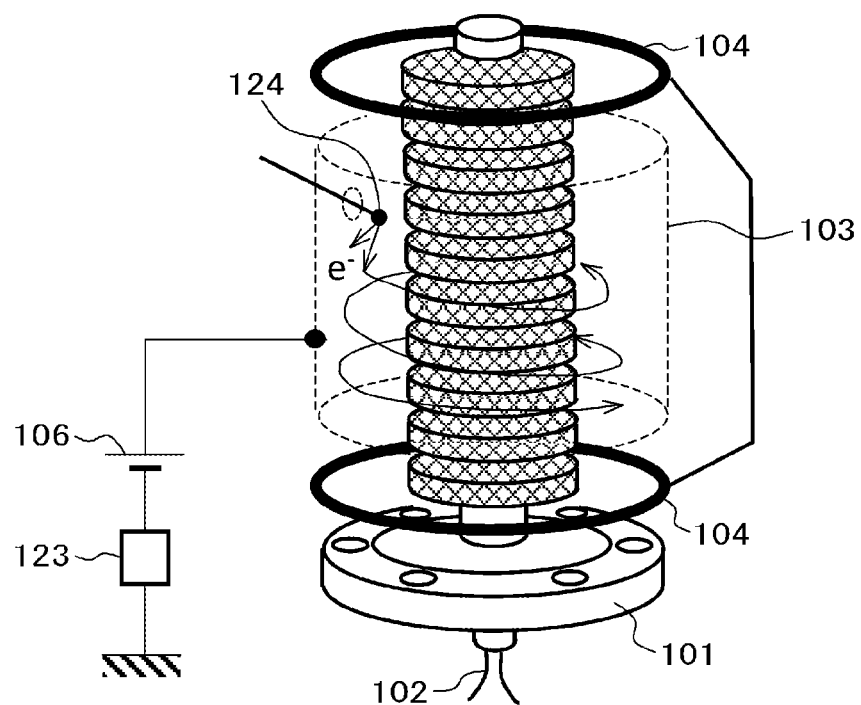
FIG. 9 is a perspective view illustrating an example of an ultrahigh vacuum evacuation pump in a vacuum apparatus according to a third embodiment of the present invention.

FIG. 9 is a perspective view illustrating an example of a magnetron non-evaporable getter pump in the scanning electron microscope according to the present embodiment. This magnetron non-evaporable getter pump has a thermionic electron source 124 disposed between or in the vicinity of a cathode 101 and an anode 103. In the present embodiment, a hole is made in a part of the anode 103, a thermionic electron source 124 is inserted into the hole such that electron emission can be performed between the anode 103 and cathode 101. The thermionic electron source 124 accelerates thermionic emission by heating a filament, and a stable emission current can be obtained. By providing a supply feed-through for heating current and a drive power source for functioning this electron source, it is possible to efficiently maintain a high evacuation speed by a stable supply of electrons.

When the magnetron non-evaporable getter pump illustrated in FIG. 9 is attached to the scanning electron microscope illustrated in FIG. 4, and an image is observed, the vibration of an optical lens barrel is suppressed, image shake is resolved, and the reduction in resolution is suppressed.

According to the present embodiment, the same effects as in the first embodiment can be obtained. In addition, by using a thermionic electron source, a stable emission current can be obtained.

Fourth Embodiment

An ultrahigh vacuum evacuation pump in a scanning electron microscope according to the fourth embodiment of the present invention will be described. Matters described in the first to third embodiments and not described in the present example can also be applied to the present embodiment unless there are special circumstances.

Figure 10:
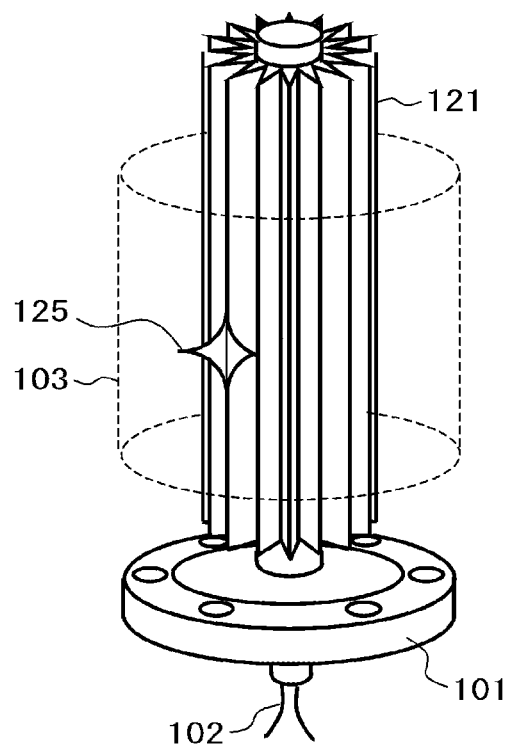
FIG. 10 is a perspective view illustrating an example of an ultrahigh vacuum evacuation pump in a vacuum apparatus according to a fourth embodiment of the present invention.

FIG. 10 is a perspective view illustrating an example of a magnetron non-evaporable getter pump in the scanning electron microscope according to the present embodiment. By forming an irregular shape in the surface shape of a non-evaporable getter alloy used for a cathode 101, this magnetron non-evaporable getter pump has a structure in which the non-evaporable getter alloy itself is used as an electron source 125 and serves both evacuation and electron supply. By using the sheet-shaped non-evaporable getter alloy 121, it is possible to relatively easily form the irregular shape. Here, an example is illustrated in which a sharp tip (electron source) 125 is disposed close to the anode 103 by cutting, with a scissors or the like, a part of a region surrounded by the anode 103. A space between the built protrusion and the anode is preferably about 1 to 5 mm.

Figure 11:
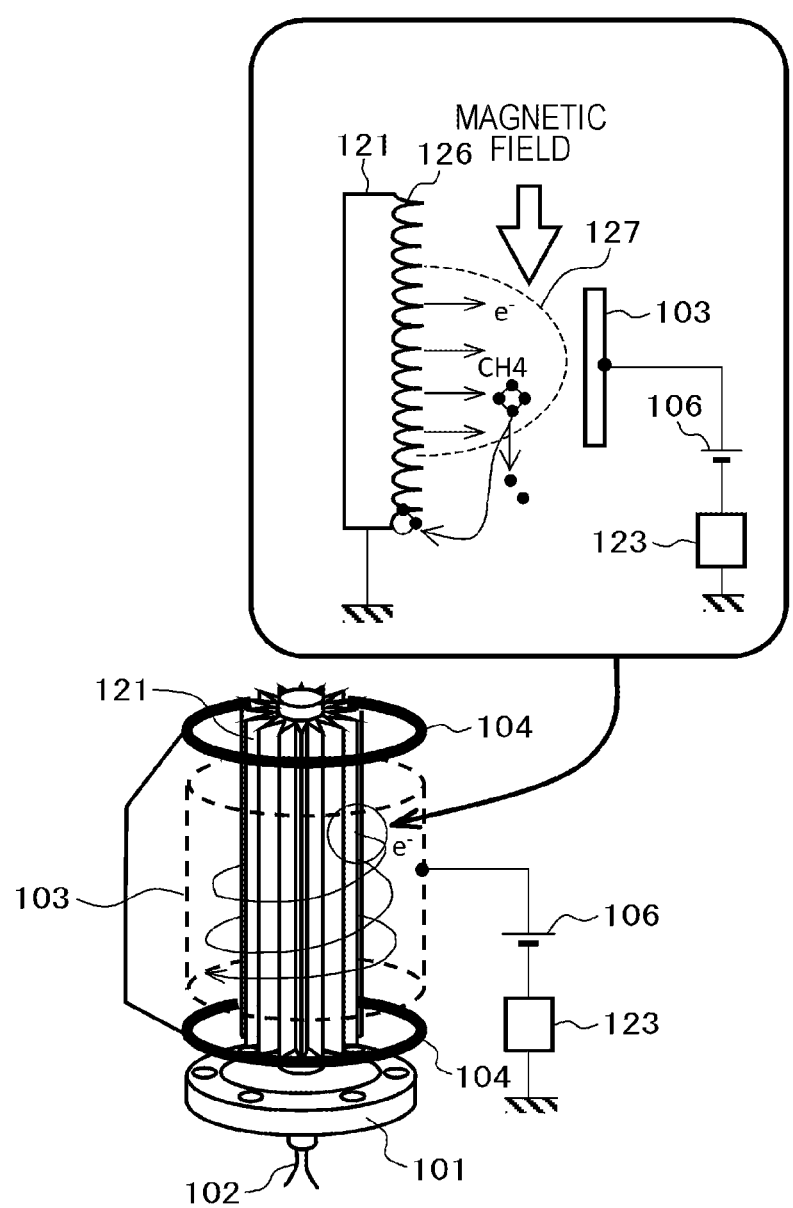
FIG. 11 is a perspective view illustrating another example of the ultrahigh vacuum evacuation pump in the vacuum apparatus according to the fourth embodiment of the present invention.

FIG. 11 is a perspective view illustrating another example of a magnetron non-evaporable getter pump in the scanning electron microscope according to the present embodiment. This magnetron non-evaporable getter pump has fine protrusions on the surface of the non-evaporable getter alloy 121. When a plurality of needle-like protrusions 126 is formed on a surface as illustrated in FIG. 11, a plurality of electron sources is formed, the number of emitted electrons increases, and the number of gas molecules to be ionized increases. Therefore, an evacuation speed of a magnetron non-evaporable getter pump improves. Furthermore, by forming a plurality of protrusions, since the gas adsorption surface area also expands, the number of gas molecules that can be adsorbed by one activation increases, and the lifetime of the magnetron non-evaporable getter pump can be prolonged.

However, the electric field intensity concentrated on such protrusions is undetermined, and it is expected that the number of emitted electrons varies for each individual pump. As a countermeasure, in vacuum start-up, the electromagnetic field intensity may be adjusted in such a manner that from the time when baking and activation of the magnetron non-evaporable getter pump are completed, the value of current flowing from the anode to the cathode during natural cooling is monitored by an ammeter 123, and a voltage applied to the anode and a value of current flowing in a Helmholtz coil are adjusted, such that a predetermined amount of current can be obtained. Once adjusted, the optimum electric field intensity (anode voltage value) of the individual and the magnetic field intensity (coil current value) are known. Accordingly, after that, the value is fixed for use.

When the magnetron non-evaporable getter pump illustrated in FIGS. 10 and 11 is attached to the scanning electron microscope illustrated in FIG. 4, and an image is observed, the vibration of an optical lens barrel is suppressed, image shake is resolved, and the reduction in resolution is suppressed.

According to the present embodiment, the same effects as in the first embodiment can be obtained. In addition, by forming an irregular shape in a surface shape of the non-evaporable getter alloy, it is possible to have a structure that serves both as evacuation and electron supply. In addition, by forming a plurality of minute protrusions in the surface shape of the non-evaporable getter alloy, it is possible to improve the evacuation speed and to prolong the lifetime of the magnetron non-evaporable getter pump.

The present invention is not limited to the above-described embodiments and includes various variations. For example, the above-described embodiments describe the present invention in detail for clarification, and every configurations described above may not be necessarily included. Further, configurations of the examples can be partially replaced with configurations of the other examples. Furthermore, a configuration of each embodiment can be added to configurations of the other examples. Further, a part of a configuration of each embodiment can be added to, deleted from, and replaced from other configurations.

Although the present invention has been described in detail, the main aspects of the present invention will be listed below.

(1) A vacuum evacuation pump, wherein a non-evaporable getter alloy is used as a rod-shaped cathode, a part of the periphery of the cathode is surrounded by a cylindrical anode, and a positive DC voltage is connected to the anode, the vacuum evacuation pump including and a coil or a ring-shaped permanent magnet disposed so as to sandwich upper and lower openings of the anode and surround the rod-shaped cathode.

(2) The vacuum evacuation pump according to (1) including an ionization vacuum gauge disposed in the vicinity of the pump.

(3) The vacuum evacuation pump according to (1), including an electron source disposed between the cathode and the anode.

(4) The vacuum evacuation pump according to (3) including a cold cathode electron source as the electron source and a unit for heating the electron source to clean a surface of the electron source.

(5) The vacuum evacuation pump according to (3) including a thermionic electron source as the electron source.

(6) The vacuum evacuation pump according to (3), in which the tip of the non-evaporable getter alloy used for the cathode is sharpened in a needle shape, and an electron source emits electrons by concentrating an electric field at the tip.

(7) A charged particle beam apparatus including the vacuum evacuation pump according to any one of (1) to (6) in a vacuum evacuation unit of a container having a charged particle source.

REFERENCE SIGNS LIST 101 rod-shaped non-evaporable getter pump (cathode)
102 heater
103 cylindrical anode
104 Helmholtz coil
105 ring-shaped non-evaporable getter alloy
106 high voltage power source
107, 107-2 electrons
108 gas molecules
109 ionized gas molecules
110 ring-shaped permanent magnet
111 ionization vacuum gauge
112 extraction electrode
113-1, 113-2, 113-3 ion pump
114 non-evaporable getter pump
115 cold cathode electron source
116 electron gun
117 diaphragm
118 condenser lens
119 objective lens
120 sample
121 non-evaporable getter alloy formed on metal sheet 122 electron source
123 ammeter
124 thermionic electron source
125 protrusion (electron source) formed by cutting
230 magnetron non-evaporable getter pump

The invention claimed is:

1. A vacuum apparatus, comprising at least one ultrahigh vacuum evacuation pump,
wherein the ultrahigh vacuum evacuation pump comprises:
a rod-shaped cathode including a non-evaporable getter alloy;
a cylindrical anode disposed so as to surround the cathode; and
a coil or ring-shaped permanent magnet disposed so as to sandwich upper and lower openings of the cylindrical anode and surround the rod-shaped cathode, wherein
an ionization vacuum gauge is disposed in the vicinity of the ultrahigh vacuum evacuation pump, and
the ionization vacuum gauge is an electron source for the ultrahigh vacuum evacuation pump.

2. The vacuum apparatus according to claim 1, wherein a second electron source is disposed between the rod-shaped cathode and the cylindrical anode.

3. The vacuum apparatus according to claim 2, wherein the second electron source is a cold cathode type electron source, and
the vacuum apparatus further comprises a unit for heating the electron source to clean a surface of the second electron source.

4. The vacuum apparatus according to claim 2, wherein the second electron source is a thermionic electron source.

5. The vacuum apparatus according to claim 2, wherein the rod-shaped cathode has a structure in which the nonevaporable getter alloy is formed on a metal sheet and folded into a bellows, and
a protrusion formed at the tip of a film of the nonevaporable getter alloy folded on the anode side serves as a third electron source.

6. The vacuum apparatus according to claim 1, wherein the coil disposed so as to sandwich upper and lower openings of the cylindrical anode and surround the rod-shaped cathode is a Helmholtz coil.

7. The vacuum apparatus according to claim 1, wherein the vacuum apparatus is a charged particle beam apparatus, and
the ultrahigh vacuum evacuation pump evacuates a region where a charged particle source of the charged particle beam apparatus is disposed.

8. The vacuum apparatus according to claim 7, wherein the charged particle source is a field emission cold cathode charged particle source.

9. A vacuum apparatus, comprising at least one ultrahigh vacuum evacuation pump,
wherein the ultrahigh vacuum evacuation pump comprises:
a rod-shaped cathode including a non-evaporable getter alloy;
a cylindrical anode disposed so as to surround the cathode;
a coil or ring-shaped permanent magnet disposed so as to sandwich upper and lower openings of the cylindrical anode and surround the rod-shaped cathode; and
an electron source is disposed between the rod-shaped cathode and the cylindrical anode.

10. The vacuum apparatus according to claim 9, wherein the electron source is a cold cathode type electron source, and
the vacuum apparatus further comprises a unit for heating the electron source to clean a surface of the electron source.

11. The vacuum apparatus according to claim 9, wherein the electron source is a thermionic electron source.

12. The vacuum apparatus according to claim 9, wherein the rod-shaped cathode has a structure in which the nonevaporable getter alloy is formed on a metal sheet and folded into a bellows, and
a protrusion formed at the tip of a film of the nonevaporable getter alloy folded on the anode side serves as an electron source.

13. The vacuum apparatus according to claim 9, wherein the coil disposed so as to sandwich upper and lower openings of the cylindrical anode and surround the rod-shaped cathode is a Helmholtz coil.

14. The vacuum apparatus according to claim 9, wherein the vacuum apparatus is a charged particle beam apparatus, and
the ultrahigh vacuum evacuation pump evacuates a region where a charged particle source of the charged particle beam apparatus is disposed.

15. The vacuum apparatus according to claim 14, wherein the charged particle source is a field emission cold cathode charged particle source.

* * * * *